United States Patent
Lee et al.

(10) Patent No.: US 9,899,436 B1
(45) Date of Patent: Feb. 20, 2018

(54) IMAGE SENSOR AND RELATED FABRICATION METHOD

(71) Applicant: Powerchip Technology Corporation, Hsinchu (TW)

(72) Inventors: Shih-Ping Lee, Hsinchu (TW); Yu-An Chen, Hsinchu (TW); Hsiu-Wen Huang, Yunlin County (TW); Chuan-Hua Chang, New Taipei (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 15/334,309

(22) Filed: Oct. 26, 2016

(30) Foreign Application Priority Data

Aug. 4, 2016 (TW) .............................. 105124710 A

(51) Int. Cl.
H01L 27/146 (2006.01)

(52) U.S. Cl.
CPC .... *H01L 27/1461* (2013.01); *H01L 27/14625* (2013.01); *H01L 27/14645* (2013.01); *H01L 27/14685* (2013.01); *H01L 27/14689* (2013.01)

(58) Field of Classification Search
CPC ...................... H01L 27/1461; H01L 27/14625
See application file for complete search history.

(56) References Cited

U.S. PATENT DOCUMENTS

| | | | |
|---|---|---|---|
| 7,358,583 B2 | 4/2008 | Reznik |
| 7,507,596 B2 | 3/2009 | Yaung |
| 7,822,300 B2 | 10/2010 | Lee |
| 8,541,857 B2 | 9/2013 | Ahn |
| 2016/0190200 A1 | 6/2016 | Shinohara |
| 2016/0197118 A1 | 7/2016 | Park |

FOREIGN PATENT DOCUMENTS

| | | |
|---|---|---|
| TW | 200703638 | 1/2007 |
| TW | 200713572 | 4/2007 |
| TW | 201533895 A | 9/2015 |

*Primary Examiner* — Thanh V Pham
(74) *Attorney, Agent, or Firm* — Winston Hsu

(57) ABSTRACT

An image sensor includes a semiconductor substrate with at least one recess disposed on its surface and in the photosensitive area defined on the surface of the semiconductor substrate, a first-conductivity-type doped region disposed in the semiconductor substrate and in the photosensitive area, and a second-conductivity-type doped region disposed on the surface of the first-conductivity-type doped region and on the surface of the recess. A photosensitive device of the image sensor is formed of the first-conductivity-type doped region and the second-conductivity-type doped region.

10 Claims, 13 Drawing Sheets

IMAGE SENSOR AND RELATED FABRICATION METHOD

BACKGROUND OF THE INVENTION

1. Field of the Invention

The present invention relates to an image sensor and related fabrication method, more particularly, to an image sensor and related fabrication method capable of improving quantum efficiency and reducing crosstalk issue.

2. Description of the Prior Art

As the development of electronic products such as digital cameras and scanners progresses, the demand for image sensors increases accordingly. In general, image sensors in common usage nowadays are divided into two main categories: charge coupled device (CCD) sensors and complementary metal-oxide-semiconductor (CMOS) image sensors, CIS. Primarily, CMOS image sensors have certain advantages of low operating voltage, low power consumption, high operating efficiency, and the ability for random access. Furthermore, CMOS image sensors are currently capable of integration with the semiconductor fabrication process. Based on those benefits, the application of CMOS image sensors has increased significantly.

In the operation theory of CMOS image sensor, the incident light is separated into a combination of light of different wavelengths. For example, the incident light can be separated into a combination of red, blue, and green light. The light of different wavelengths is received by respective optical sensors such as photodiodes and is subsequently transformed into digital signals of different intensities. However, as the dimensions of the pixel are reduced, the size of the photodiode is reduced together. Accordingly, the crosstalk between the pixels is increased, and the optical sensitivity is decreased. Furthermore, since CMOS image sensor is usually disposed in a semiconductor substrate with high reflectivity, the light is easy to be reflected by the semiconductor substrate when the light propagates to the semiconductor substrate. Accordingly, the light cannot enter the optical sensors effectively, which leads to the problem of low quantum efficiency in the conventional CMOS image sensor. Thus, in order to solve the above-mentioned shortcomings, there is still a need in the industry to provide a CMOS image sensor having high quantum efficiency and less crosstalk.

SUMMARY OF THE INVENTION

It is therefore one of the objectives of the present invention to provide an image sensor and related fabrication method for improving quantum efficiency and reducing crosstalk of the image sensor.

According to an embodiment of the present invention, an image sensor is provided. The image sensor includes a semiconductor substrate, a first-conductivity-type doped region, a second-conductivity-type doped region, a gate, a gate oxide layer and a doped diffusion region. A photosensitive area is defined on a surface of the semiconductor substrate, and the surface of the semiconductor substrate has at least one recess in the photosensitive area. The first-conductivity-type doped region is disposed in the semiconductor substrate and in the photosensitive area. The second-conductivity-type doped region is disposed on a surface of the first-conductivity-type doped region and on a surface of the recess, wherein the first-conductivity-type doped region and the second-conductivity-type doped region have different conductivity types, and the first-conductivity-type doped region and the second-conductivity-type doped region form a photosensitive device. The gate is disposed on the semiconductor substrate. The gate oxide layer is disposed between the gate and the semiconductor substrate. The doped diffusion region is disposed in the semiconductor substrate, and the gate is disposed between the first-conductivity-type doped region and the doped diffusion region.

According to another embodiment of the present invention, a fabrication method of an image sensor including following steps is provided. First, a semiconductor substrate is provided, wherein a photosensitive area is defined on a surface of the semiconductor substrate. Next, a first-conductivity-type doped region is formed near the surface of the semiconductor substrate and in the photosensitive area. An etching process is then performed to remove a portion of the first-conductivity-type doped region of the semiconductor substrate so as to form at least one recess, wherein the recess is disposed in the photosensitive area. Next, an ion implantation process is performed to form a second-conductivity-type doped region on a surface of the first-conductivity-type doped region in the photosensitive area, wherein the first-conductivity-type doped region and the second-conductivity-type doped region have different conductivity types, and the first-conductivity-type doped region and the second-conductivity-type doped region form a photosensitive device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic diagrams illustrating a fabrication method of an image sensor of a first embodiment of the present invention, wherein:

FIG. 1 is a schematic diagram illustrating the step of forming a first-conductive-type doped region in a semiconductor substrate;

FIG. 2 is a schematic diagram illustrating the fabrication method subsequent to FIG. 1;

FIG. 3 is a schematic diagram illustrating the fabrication method subsequent to FIG. 2;

FIG. 4 is a schematic diagram illustrating the fabrication method subsequent to FIG. 3;

FIG. 5 is a schematic diagram illustrating the fabrication method subsequent to FIG. 4;

FIG. 6 is a schematic diagram illustrating the fabrication method subsequent to FIG. 5; and FIG. 7 is a schematic diagram illustrating the fabrication method subsequent to FIG. 6, and also illustrating the structure of an image sensor according to a first embodiment of the present invention the present invention.

FIGS. 11-12 are schematic diagrams illustrating a fabrication method of an image sensor of a second embodiment of the present invention, wherein:

FIG. 11 is a schematic diagram illustrating the step of forming a first-conductive-type doped region in a semiconductor substrate; and FIG. 12 is a schematic diagram illustrating the fabrication method subsequent to FIG. 11.

DETAILED DESCRIPTION

To provide a better understanding of the present invention, preferred embodiments will be detailed as follows. The preferred embodiments of the present invention are illustrated in the accompanying drawings with numbered elements to elaborate the contents and effects to be achieved.

Figure 1:
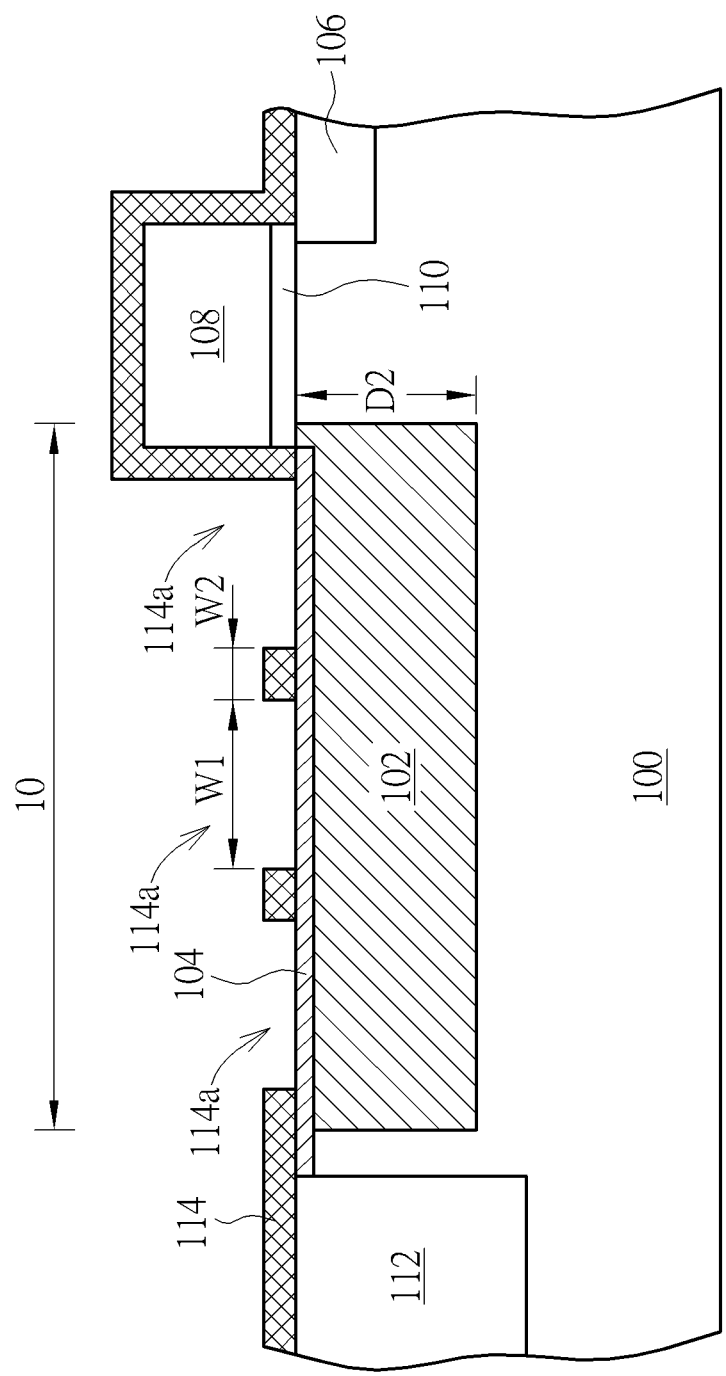
Figure 6:
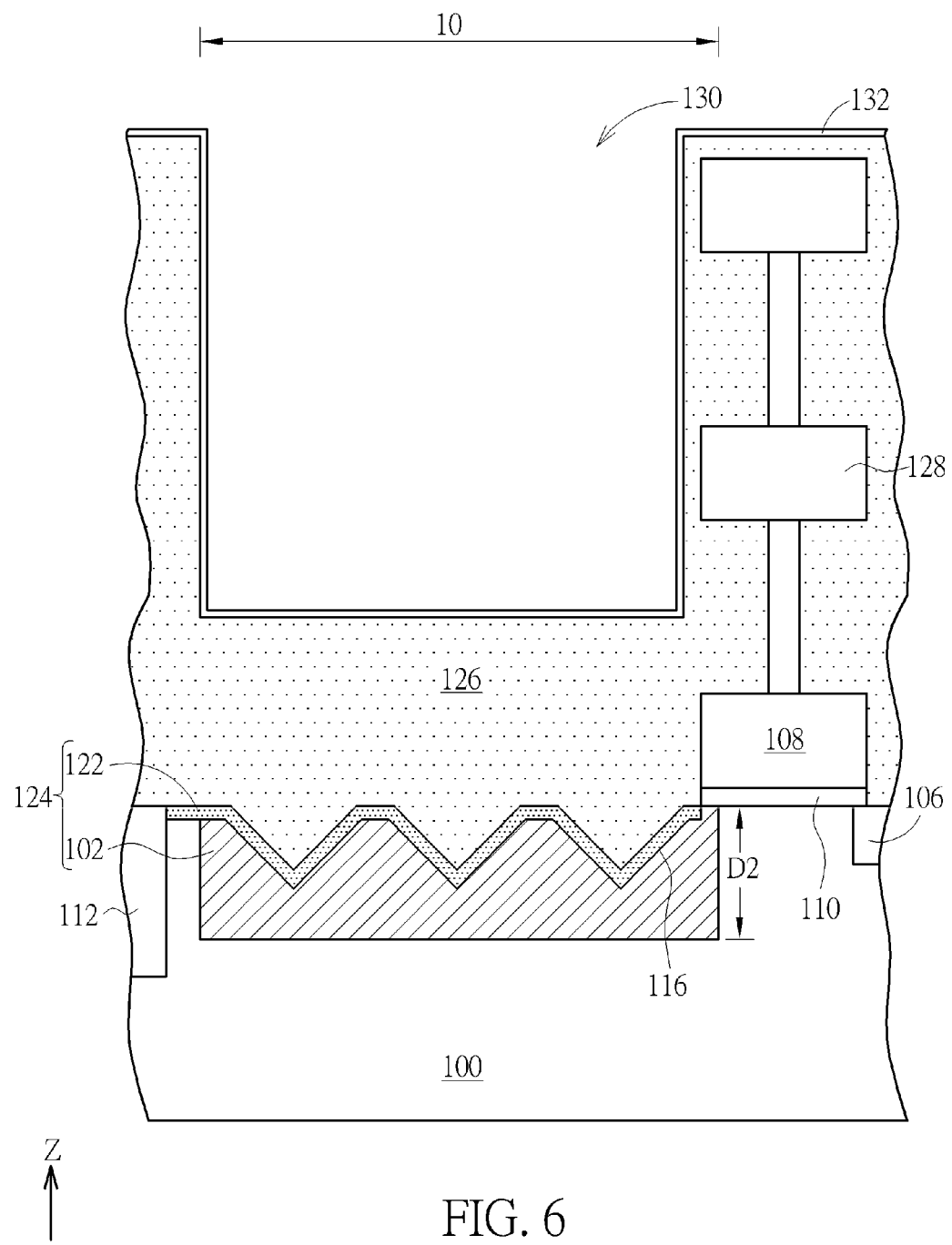
Figure 7:
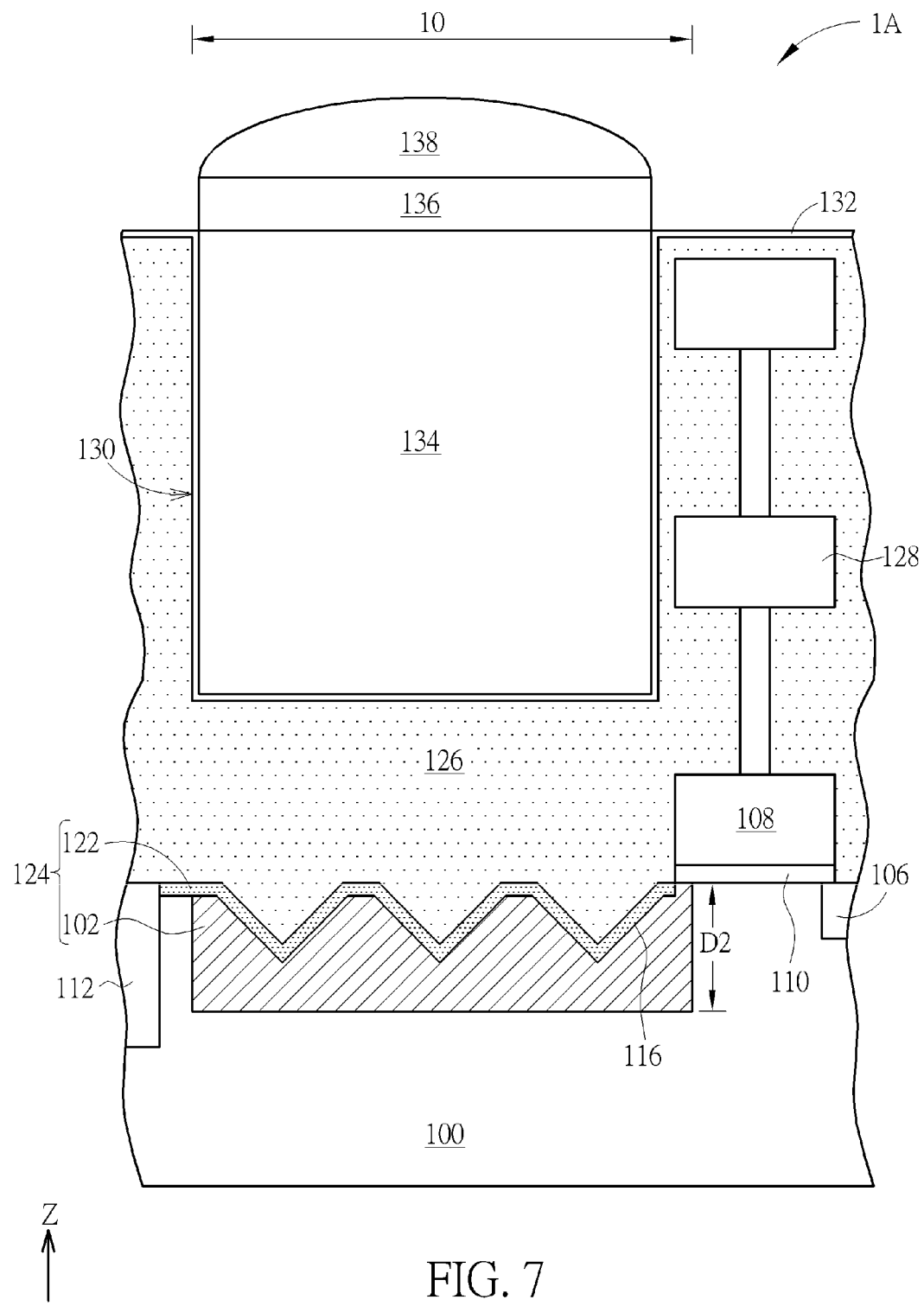
Figure 8:
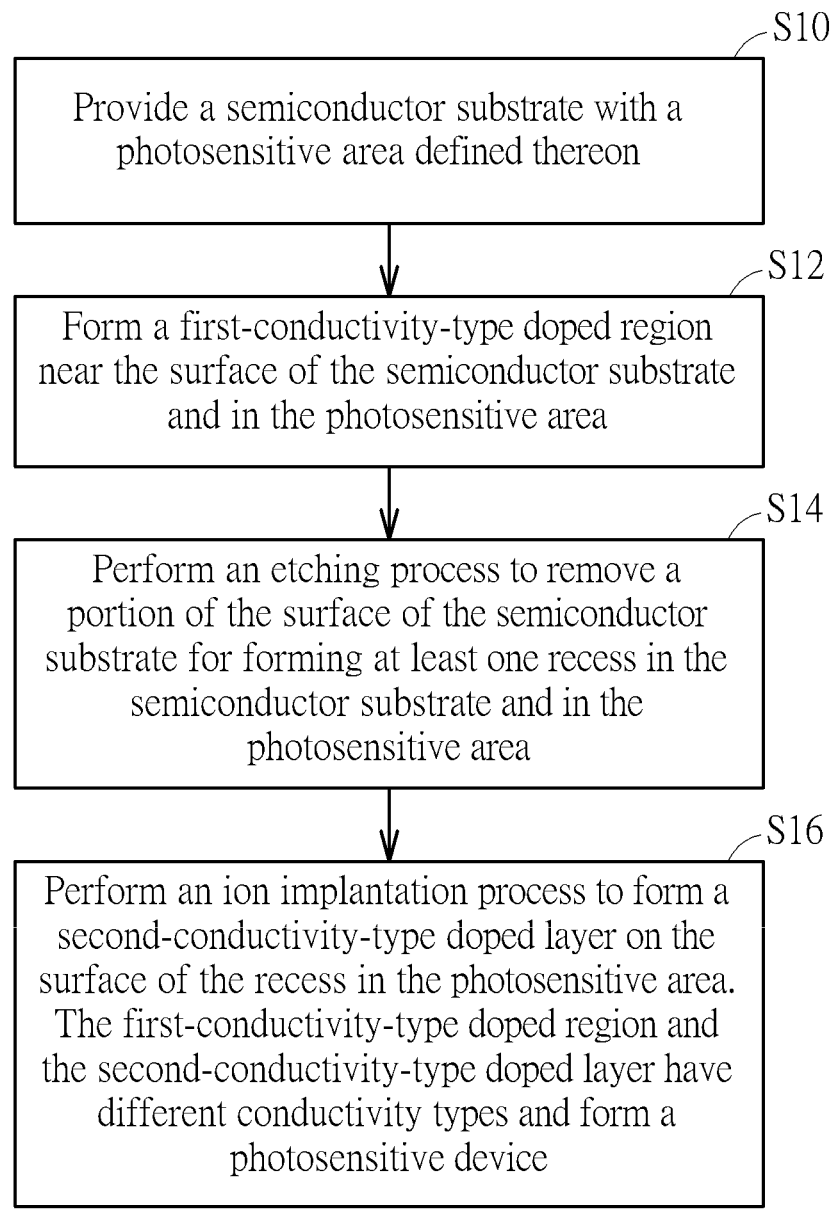
FIG. 8 is a schematic diagram illustrating a process flow of the fabrication method of the image sensor of the present invention.

Referring to FIG. 1 to FIG. 8, FIGS. 1-7 are schematic diagrams illustrating a fabrication method of an image sensor 1A according to a first embodiment of the present invention, and FIG. 8 is a schematic diagram illustrating a process flow of the fabrication method of the image sensor 1A according to the first embodiment of the present invention. The image sensor 1A of this embodiment is a front side illumination (FSI) image sensor. As shown in FIG. 1, a semiconductor substrate 100 is provided first, and a photosensitive area 10 is defined on the surface of the semiconductor substrate 100. The semiconductor substrate 100 of this embodiment is, but not limited to, a p-type semiconductor substrate, such as a silicon substrate including p-type dopants. The semiconductor substrate 100 may be a silicon substrate, an epitaxial silicon substrate, a silicon-germanium (SiGe) substrate, a silicon carbide (SiC) substrate or a silicon-on-insulator (SOI) substrate, but not limited thereto. Next, a first-conductivity-type doped region 102, a second-conductivity-type sacrificial layer 104 and a doped diffusion region 106 are formed in the surface of the semiconductor substrate 100. The first-conductivity-type doped region 102 is formed near the surface of the semiconductor substrate 100 and in the photosensitive area 10. For example, the depth D2 of the first-conductivity-type doped region 102 is less than or equal to 0.2 micrometers approximately, but not limited thereto. In this embodiment, the dopants of the first-conductivity-type doped region 102 have a conductivity type opposite to the dopants of the semiconductor substrate 100. For example, the first-conductivity-type doped region 102 may be an n-type doped region. The first-conductivity-type doped region 102 may be formed through an ion implantation process by implanting n-type dopants into the semiconductor substrate 100. The second-conductivity-type sacrificial layer 104 is formed in the photosensitive area 10 and covers the surface of the first-conductivity-type doped region 102. The second-conductivity-type sacrificial layer 104 includes dopants having the same conductivity type as the semiconductor substrate 100, but having a higher doping concentration. For example, the second-conductivity-type sacrificial layer 104 may be a p-type doped region, and may be formed through an ion implantation process by implanting p-type dopants into the semiconductor substrate 100. Specifically, by the way of adjusting the doping energy of dopant-implantation, the second-conductivity-type sacrificial layer 104 can be formed close to the surface of the semiconductor substrate 100, and the first-conductivity-type doped region 102 can be formed deeper in the semiconductor substrate 100. The doped diffusion region 106 is formed out of the photosensitive area 10, and includes the dopants having the conductivity type opposite to the semiconductor substrate 100. The doped diffusion region 106 may be an n-type doped region for instance, and may be formed through the same method as the first-conductivity-type doped region 102. In this embodiment, the doped diffusion region 106 serves as a floating diffusion (FD) region of the image sensor 1A. In a variant embodiment, the semiconductor substrate 100 may be an n-type semiconductor substrate, the first-conductivity-type doped region 102 and the doped diffusion region 106 may be p-type doped regions respectively, and the second-conductivity-type sacrificial layer 104 may be an n-type doped region.

Next, a gate oxide layer 110 and a gate 108 are formed on the semiconductor substrate 100 sequentially, wherein the gate oxide layer 110 is disposed between the gate 108 and the semiconductor substrate 100. The gate 108 is approximately disposed between the first-conductivity-type doped region 102 and the doped diffusion region 106, and the first-conductivity-type doped region 102 extends to a portion of the semiconductor substrate 100 below the gate 108 such that a part of the first-conductivity-type doped region 102 is covered by a portion of the gate 108. In this embodiment, the gate oxide layer 110 may include silicon oxide, and the gate 108 may include polysilicon, but not limited thereto. Furthermore, the gate 108 serves as a transfer gate (Tx) of the image sensor 1A. In another embodiment, the gate oxide layer 110 and the gate 108 may be formed before forming the first-conductivity-type doped region 102, the second-conductivity-type sacrificial layer 104 and the doped diffusion region 106. In still another embodiment, the gate oxide layer 110 and the gate 108 may be formed after forming the first-conductivity-type doped region 102 but before forming the second-conductivity-type sacrificial layer 104. Briefly speaking, the present invention does not limit when to form the gate oxide layer 110 and the gate 108. In addition, an isolation structure 112 may be selectively formed in the semiconductor substrate 100 before forming the first-conductivity-type doped region 102, the second-conductivity-type sacrificial layer 104 and the doped diffusion region 106. The isolation structure 112 may be a shallow trench isolation (STI), a local oxidation of silicon isolation layer (LOCOS), or a junction isolation, for preventing the image sensor 1A from being coupled to other devices and resulting in short-circuit issue. As an example, the method of forming the isolation structure 112 may include forming a mask on the semiconductor substrate 100 first, performing an etching process to form a trench in the semiconductor substrate 100, then filling an insulating material (such as silicon oxide) into the trench, and removing the mask. Furthermore, a screen oxide layer (not shown) and other pad layers or liners (not shown) may be selectively formed on the semiconductor substrate 100 in this embodiment of the present invention.

Next, a patterned mask layer 114 is formed on the surface of the semiconductor substrate 100 for defining the pattern of one or more recesses in the photosensitive area 10. The patterned mask layer 114 of this embodiment defines the patterns of a plurality of recesses, and therefore the patterned mask layer 114 includes a plurality of openings 114a, wherein the width W1 of each opening 114a is about 0.15 micrometers for example. In the photosensitive area 10, the width W2 of the patterned mask layer 114 disposed between the adjoining openings 114a is about 60 nanometers for example. It should be noted that the above mentioned width W1 and width W2 are examples only, not used for limiting the present invention. Furthermore, another portion of the patterned mask layer 114 disposed out of the photosensitive area 10 covers the isolation structure 112, the gate oxide layer 110 and the gate 108, such that the isolation structure 112, the gate oxide layer 110 and the gate 108 will not be influenced by the following processes. The method of forming the patterned mask layer 114 may include fully coating a photoresist layer first, exposing the photoresist layer with a mask, and then developing the exposed photoresist layer to form the patterned mask layer 114.

Figure 2:
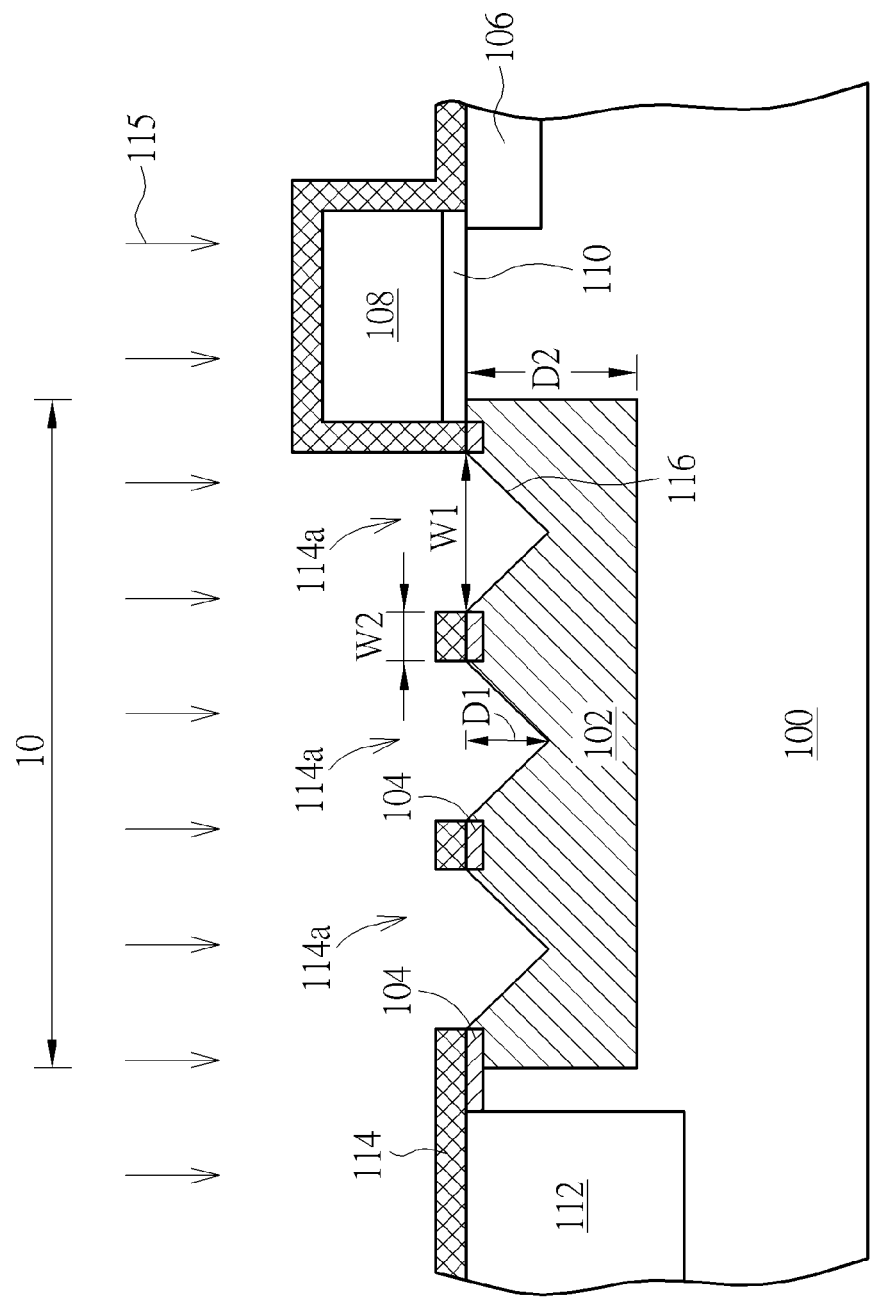

Next, as shown in FIG. 2, an etching process 115 is performed by taking the patterned mask layer 114 as an etching mask, so as to remove a portion of the first-conductivity-type doped region 102 of the semiconductor substrate 100 and form at least one recess 116 in the semiconductor substrate 100. Since the number of the recesses 116 is determined by the number of the openings 114a of the patterned mask layer 114, a plurality of recesses 116 are formed in the semiconductor substrate 100 in this embodiment. In addition, a portion of the second-conductivity-type sacrificial layer 104 is also removed through the etching process 115, and another portion of the second-conductivity-type sacrificial layer 104 covered by the patterned mask layer 114 is left after the etching process 115. As an example, the remaining second-conductivity-type sacrificial layer 104 in the photosensitive area 10 has the width W2 of about 60 nanometers, which also means that the distance between the adjoining recesses 116 is about 60 nanometers, but not limited thereto. The etching process 115 of this embodiment is an anisotropic etching process, such as an anisotropic wet etching process, an anisotropic dry etching process, or a combination of the anisotropic wet etching process and the anisotropic dry etching process. For instance, the etchant of the anisotropic wet etching process may include tetramethylammonium hydroxide (TMAH), ethylene diamine, ethylene diamine and pyrocatechol (EDP), alkali-based etching solution, diluted hydrofluoric (DHF), hydrogen fluoride (HF), buffered oxide etching (BOE) solution, SC-1 cleaning liquid, or a combination of the aforementioned etchants. As an example, the etchant of this embodiment includes TMAH and DHF, wherein the DHF is used for removing the screen oxide layer on the surface of the semiconductor substrate 100, and the TMAH is used for removing the material of the semiconductor substrate 100. The etching process may include dipping the semiconductor substrate 100 into the TMAH solution with a concentration of about 25 wt % for 12 seconds, so as to form the recesses 116 having a depth D1 that is about 0.1 micrometers. The width of the recesses 116 is substantially equal to the width W1 of the openings 114a of the patterned mask layer 114. According to the present invention, in various embodiments, the depth D1 of the recesses 116 may reach to about 1 micrometer, and the width W1 of the openings 114a may reach to about 1.5 micrometers, but not limited thereto. Since the etching process 115 of this embodiment is an anisotropic etching process, the depths and the cross-sectional profiles of the recesses 116 formed through the etching process 115 are related to the selected etchant, the process duration, and the size and the shape of the openings 114a of the patterned mask layer 114. Especially, the cross-sectional profile and the depth of the recess 116 may be controlled by adjusting the duration of the etching process 115. For example, since the etching rates are different in different crystalline directions, the size of each of the recesses 116 formed in this embodiment is gradually reduced from the opening of the recess 116 to the bottom of the recess 116. In this embodiment, the recesses 116 are cone-shaped recesses, but not limited thereto. In other embodiments, the recesses may be hemispherical-shaped recesses, or have inverted trapezoid cross-sectional profiles. In addition, the shapes of the opening of the recesses 116 in the top-view may include circle, square, rectangle, rhombus, elongated rectangle, hexagon, cross, or any other suitable shapes.

Figure 3:
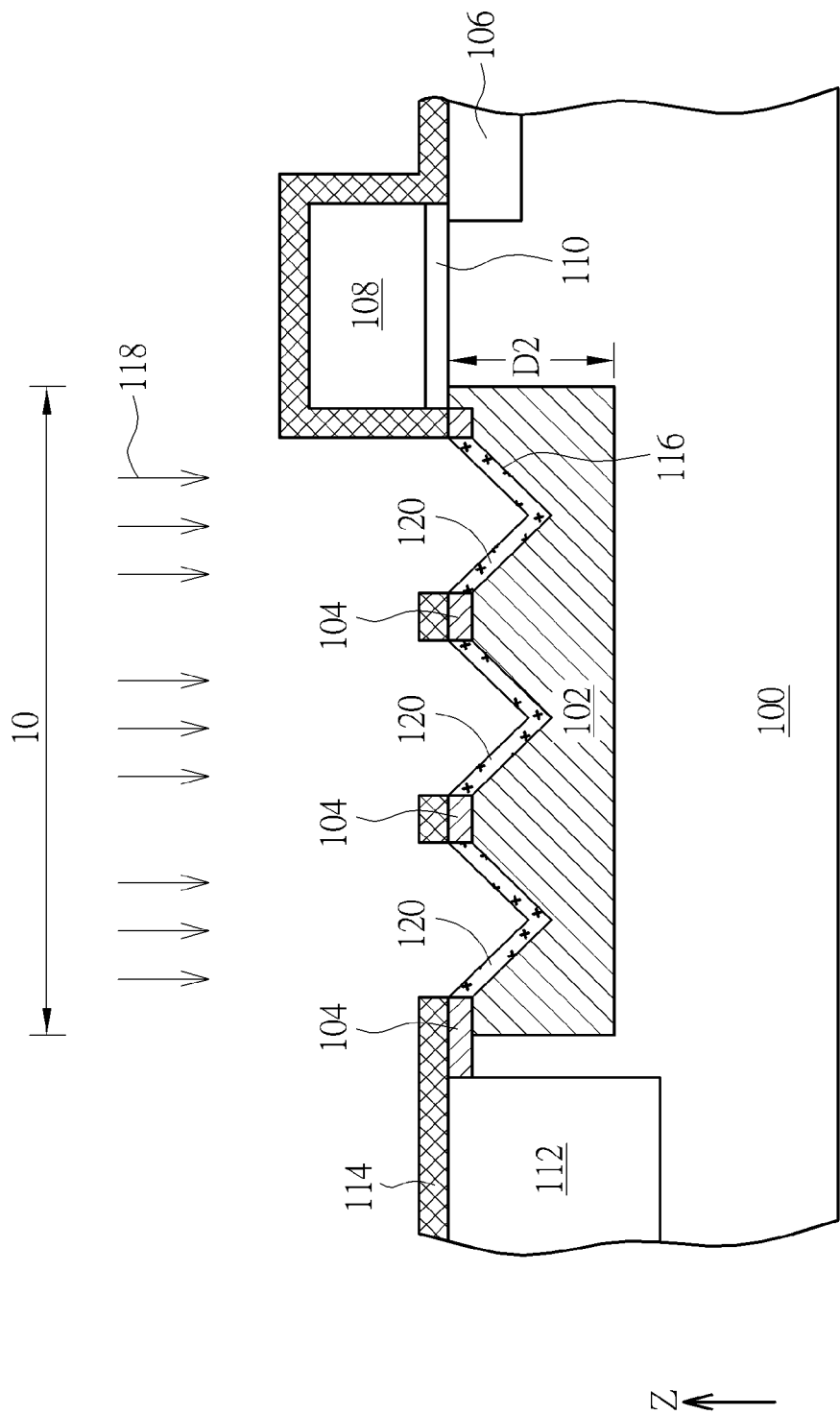
Figure 4:
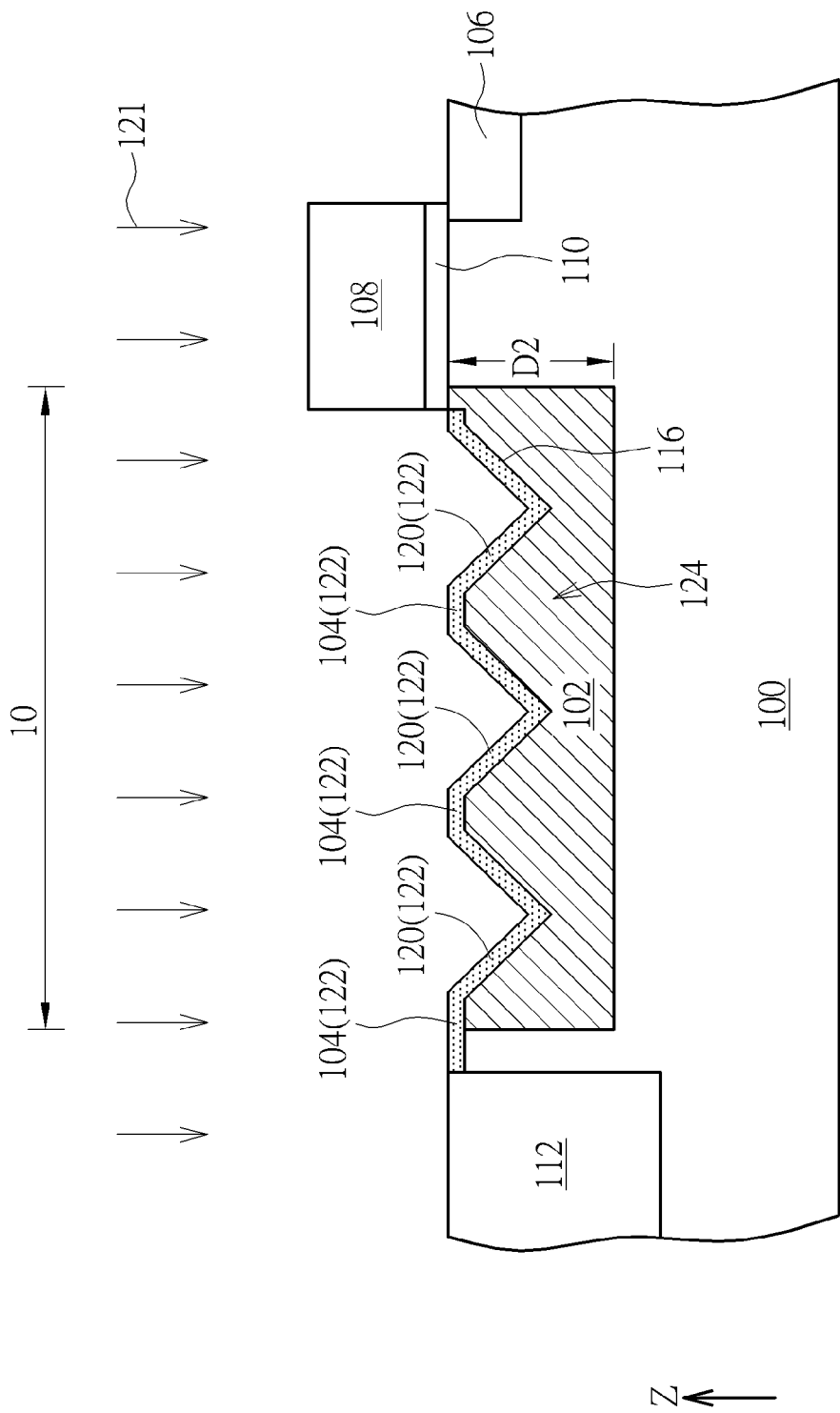

Next, as shown in FIG. 3, an ion implantation process 118 is performed by taking the patterned mask layer 114 as a mask to implant the second-conductivity-type dopants into the semiconductor substrate 100, so as to form a second-conductivity-type doped layer 120 on the surface of the first-conductivity-type doped region 102 in the photosensitive area 10. The second-conductivity-type doped layer 120 includes the dopants having the same conductivity type as the second-conductivity-type sacrificial layer 104, and the second-conductivity-type doped layer 120 is a p-type doped region for example. The ion implantation process 118 of this embodiment may be a plasma doping process for instance. The ion implantation process 118 is not limited to implanting the dopants only along the direction perpendicular to the surface of the semiconductor substrate 100 (such as the direction Z shown in FIG. 3), and the dopants may be implanted along various oblique directions. Sequentially, as shown in FIG. 4, the patterned mask layer 114 is removed, and an annealing process 121 may be selectively performed after the ion implantation process 118 to activate the dopants in the second-conductivity-type sacrificial layer 104 and the second-conductivity-type doped layer 120. The annealing process 121 of this embodiment may be a laser annealing process for example, but not limited thereto. The remaining portion of the second-conductivity-type sacrificial layer 104 after the etching process 115 is connected to the second-conductivity-type doped layer 120, so as to form a second-conductivity-type doped region 122 on the surface of the first-conductivity-type doped region 102. The second-conductivity-type doped region 122 in this embodiment is a p-type doped region. The first-conductivity-type doped region 102 and the second-conductivity-type doped region 122 form a photosensitive device 124 of this embodiment, and the photosensitive device 124 is a pinned photodiode for example.

Figure 5:
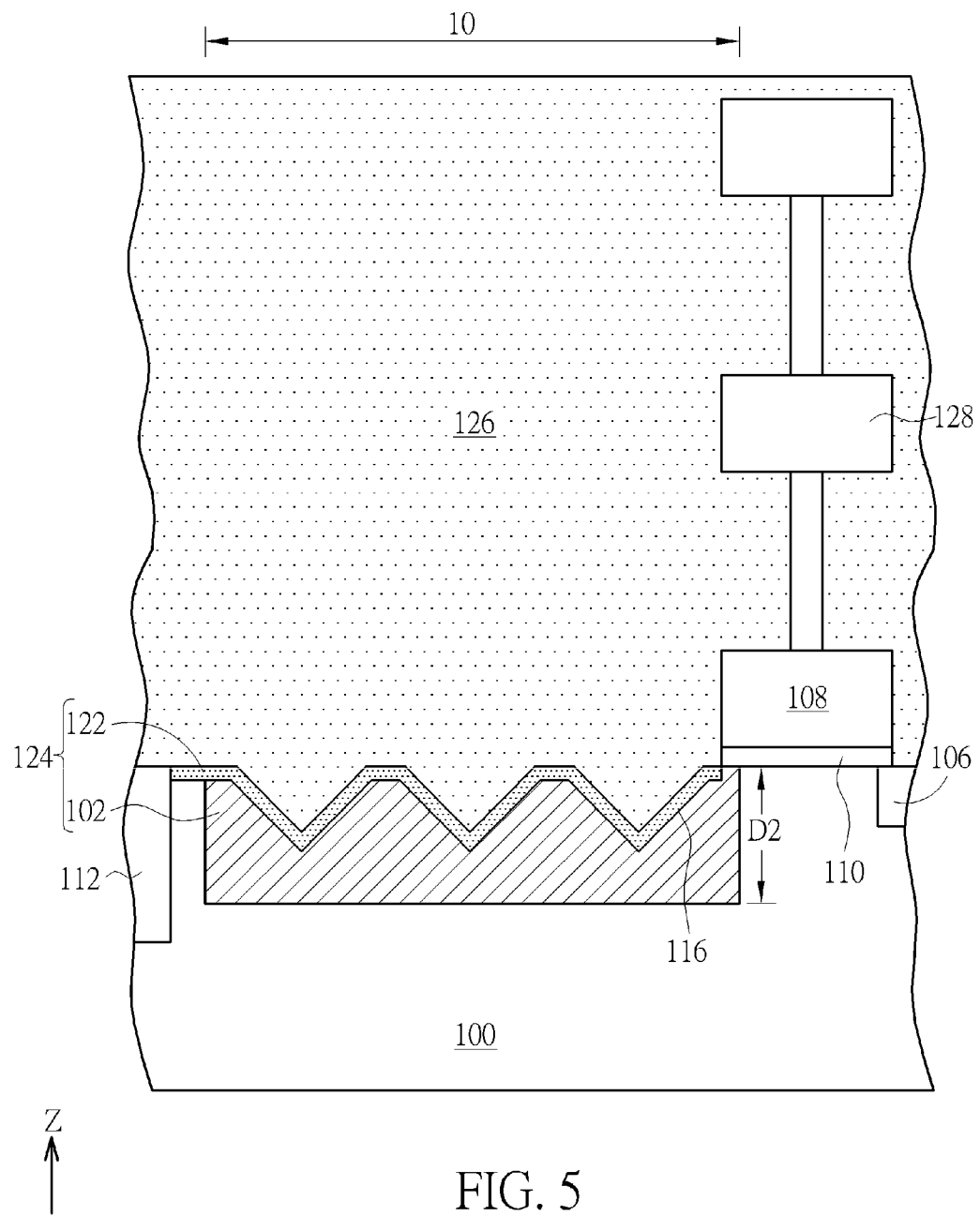

Sequentially, referring to FIG. 5, a dielectric layer 126 and a conductive line 128 disposed in the dielectric layer 126 are formed on the surface of the semiconductor substrate 100. The dielectric layer 126 covers the photosensitive device 124 and is filled in the recesses 116. The conductive line 128 may be connected to the gate 108. The dielectric layer 126 may include a plurality of inter-layer dielectric layers, and the material of the dielectric layer 126 may include a low-K dielectric material, such as silicon oxide, borophosphosilicate glass (BPSG), phosphosilicate glass (PSG), fluorinated silicate glass (FSG), carbon-doped silicon oxide or the like. The method of forming the dielectric layer 126 may include the chemical vapor deposition (CVD) technique for example, but not limited thereto. The conductive line 128 may be a multilayer-interconnect (MLI) structure for example, and the dielectric layer 126 can be used for isolating and separating the MLI structure from other conductive devices on the semiconductor substrate 100. For example, the method of patterning the conductive line 128 may include a plasma etching or a damascene process, and the material of the conductive line 128 may include aluminum, copper, doped polysilicon or the like. In this embodiment, the dielectric layer 126 and the conductive line 128 may be fabricated by sequentially forming multiple inter-layer dielectric layers, interconnects, and contacts or vias.

Next, as shown in FIG. 6, a light pipe opening 130 is formed in the dielectric layer 126. The method of forming the light pipe opening 130 may include forming a patterned mask layer (not shown in figures) on the dielectric layer 126 to define the pattern of the light pipe opening 130 first, and performing an etching process next, so as to form the light pipe opening 130 in the dielectric layer 126. The cross-sectional profile of the light pipe opening 130 may have a vertical sidewall as shown in FIG. 6, but may have an inclined sidewall in another embodiment such that the area of the bottom of the light pipe opening 130 is less than the area of the top of the light pipe opening 130. Next, a barrier layer 132 can be selectively formed on the dielectric layer 126 and the sidewall and the bottom surface of the light pipe opening 130. The material of the barrier layer 132 may include silicon nitride (SiN) or silicon oxynitride (SiON). For example, the barrier layer 132 can prevent the devices underneath from being damaged by oxygen and moisture, but not limited thereto. Then, as shown in FIG. 7, a material having a high refractive index is filled in the light pipe opening 130 to form a light pipe 134 above the photosensitive device 124. A chemical mechanical polishing (CMP) process may be performed to enable the light pipe 134 to have a flat surface. Next, a color filter layer 136 and a micro lens 138 are sequentially formed on the surface of the light pipe 134. The color filter layer 136 includes a colored photoresist pattern for example, and may be formed through a photolithography and etching process. In this embodiment, the color filter layer 136 is disposed between the micro lens 138 and the light pipe 134, and the light pipe 134 and the conductive line 128 are disposed between the color filter layer 136 and the recesses 116 of the photosensitive device 124. According to the above mentioned processes, the fabrication of the image sensor 1A of the first embodiment of the present invention is finished.

In short, the fabrication method of the image sensor 1A of the present invention mainly includes the steps shown in FIG. 8:

Step S10: Providing a semiconductor substrate, wherein a photosensitive area is defined on the surface of the semiconductor substrate;

Step S12: Forming a first-conductivity-type doped region near the surface of the semiconductor substrate and in the photosensitive area;

Step S14: Performing an etching process to remove a portion of the surface of the semiconductor substrate for forming at least one recess in the semiconductor substrate and in the photosensitive area; and Step S16: Performing an ion implantation process to form a second-conductivity-type doped layer on the surface of the recess in the photosensitive area, wherein the first-conductivity-type doped region and the second-conductivity-type doped layer have different conductivity types, and the first-conductivity-type doped region and the second-conductivity-type doped layer form a photosensitive device.

Referring back to FIG. 7, the structure of the image sensor 1A of this embodiment is described below. The image sensor 1A includes the semiconductor substrate 100, the first-conductivity-type doped region 102, the second-conductivity-type doped region 122, the gate 108, the gate oxide layer 110 and the doped diffusion region 106. In this embodiment, the photosensitive area 10 is defined on the surface of the semiconductor substrate 100, and the surface of the semiconductor substrate 100 has a plurality of recesses 116 distributed in the photosensitive area 10. The size of the recesses 116 is gradually reduced from the openings of the recesses 116 to the bottoms of the recesses 116. The recesses 116 of this embodiment are cone-shaped recesses, but not limited thereto. In other embodiments, the recesses may be hemispheric recesses, or may have inverted trapezoid cross-sectional profiles. In addition, the shapes of the openings of the recesses 116 in the top-view may include circle, square, rectangle, rhombus, elongated rectangle, hexagon, or other suitable shapes.

Furthermore, the first-conductivity-type doped region 102 is disposed in the semiconductor substrate 100 and in the photosensitive area 10, and the second-conductivity-type doped region 122 is disposed on the surface of the first-conductivity-type doped region 102 and the surface of the recesses 116. In this embodiment, the first-conductivity-type doped region 102 is an n-type doped region, the second-conductivity-type doped region 122 is a p-type doped region, and the first-conductivity-type doped region 102 and the second-conductivity-type doped region 122 form the photosensitive device 124. The photosensitive device 124 of this embodiment is a pinned photodiode. In other embodiments, a barrier layer of SiN, an anti-reflection coating (ARC), or a contact etch stop layer, CESL (not shown) may be disposed on the photosensitive device 124. The aforementioned layers are not shown in figures of the present application.

Moreover, the gate 108 is disposed on the semiconductor substrate 100, and the first-conductivity-type doped region 102 extends to a portion of the semiconductor substrate 100 below the gate 108 such that apart of the first-conductivity-type doped region 102 is covered by the portion of the gate 108. In this embodiment, the gate 108 is a transfer gate of the image sensor 1A, the gate oxide layer 110 is disposed between the gate 108 and the semiconductor substrate 100, the doped diffusion region 106 is disposed in the semiconductor substrate 100 and at one side of the gate 108, and the gate 108 is approximately disposed between the first-conductivity-type doped region 102 and the doped diffusion region 106. The doped diffusion region 106 of this embodiment serves as a floating diffusion (FD) region of the image sensor 1A, and it is an n-type doped region. The photosensitive device 124 generates photo electrons under illumination, and the photo electrons can be transmitted to the FD region, i.e. the doped diffusion region 106, through providing a voltage to the gate 108 and will be further transformed into electric signals for output. The image sensor 1A may further include a reset transistor, a source follower transistor, or a read select transistor, and may include a pixel circuit having three transistors (3 T) or four transistors (4 T). For emphasizing the characteristic features of the image sensor 1A of this embodiment, the aforementioned devices are not shown in the figures.

In addition, the image sensor 1A of this embodiment includes the dielectric layer 126, the conductive line 128, the color filter layer 136 and the micro lens 138 disposed on the surface of the semiconductor substrate 100. The dielectric layer 126 is filled in the recesses 116, the conductive line 128 is electrically connected to the gate 108, and the conductive line 128 is disposed in the dielectric layer 126 but does not cover the photosensitive area 10. The color filter layer 136 and the micro lens 138 are disposed on the surface of the dielectric layer 126 and cover the photosensitive area 10. The color of the color filter layer 136 may include red, blue, or green, so that the photosensitive device 124 can detect the light with a specific color. The image sensor 1A may selectively include the light pipe 134 disposed in the dielectric layer 126 and between the color filter layer 136 and the recesses 116. In another embodiment, the light pipe 134 may extend downward to the top of the recesses 116 and is in contact with the second-conductivity-type doped region 122. Since the light pipe 134 includes the material having high refractive index, its refractive index is greater than the refractive index of the dielectric layer 126, such that total reflection easily occurs in the light pipe 134 when light entering the light pipe 134. Therefore, the light pipe 134 assists in guiding light to the photosensitive device 124, and further improves the quantum efficiency of the image sensor 1A.

According to this embodiment, the surface of the photosensitive device 124 has recesses 116, and the profile of each recess 116 is gradually reduced from the opening to the bottom of the recess 116. The specific profile of each recess 116 helps to keep on reflecting light in the recess 116 and also guide the light to the bottom of the recess 116. In addition, the recesses 116 can significantly enhance the sensing area of the photosensitive device 124 in the photosensitive area 10, so as to effectively increase the percentage of the light absorbed by the photosensitive device 124. As a result, the quantum efficiency of the image sensor 1A can be improved. Moreover, the recesses 116 prevent the light from being reflected to the photosensitive devices of other adjoining pixels and thus reduce the crosstalk issue.

The image sensor and the related fabrication method of the present invention are not limited to the aforementioned embodiment. The following description continues to detail other embodiments or variant embodiments. To simplify the description and show the difference between other embodiments, variant embodiments and the above-mentioned embodiment, identical components in each of the following embodiments are marked with identical symbols, and the identical features will not be redundantly described.

Figure 9:
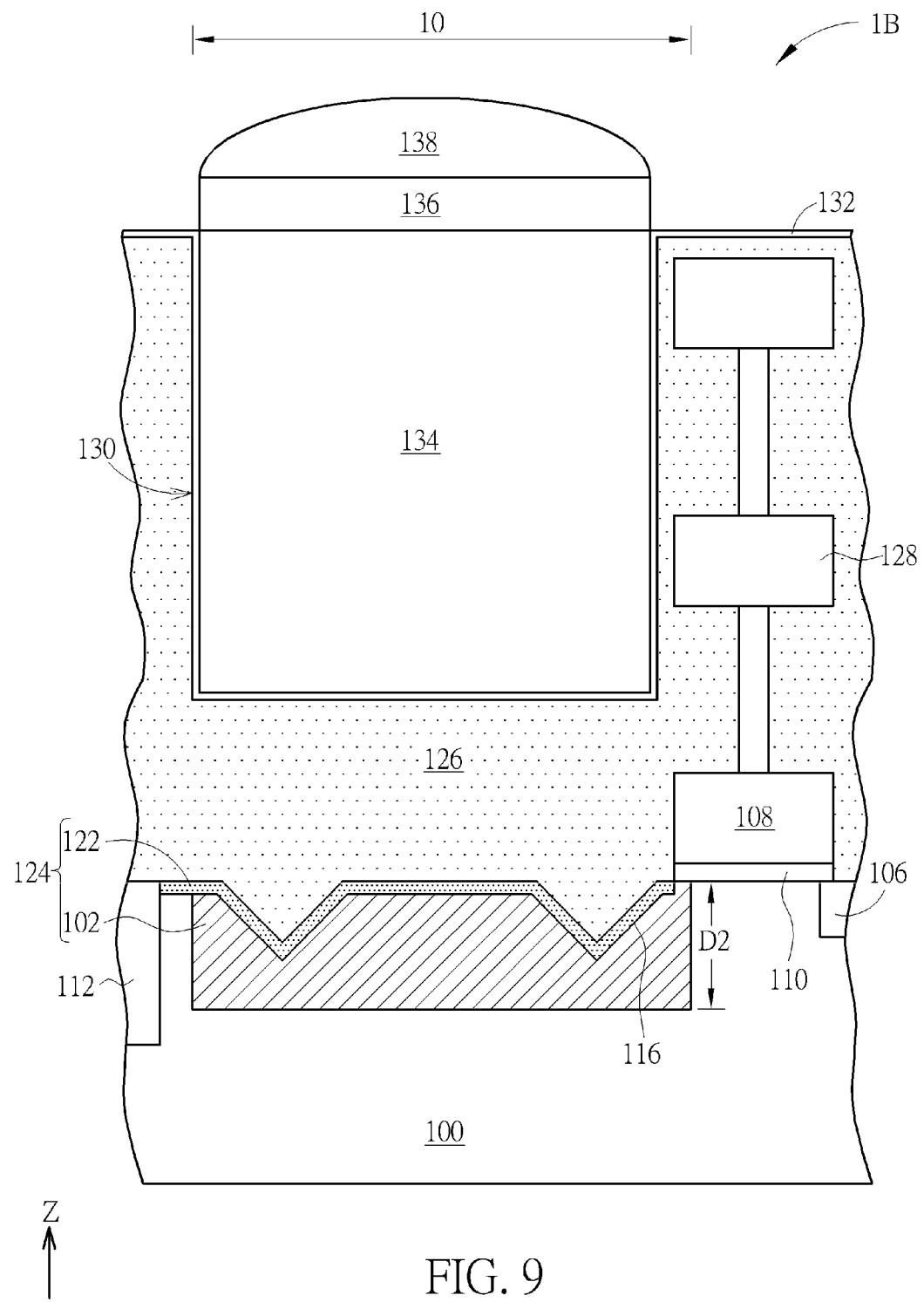
FIG. 9 is a schematic diagram illustrating a cross-sectional view of an image sensor of a first variant embodiment of the first embodiment of the present invention.
Figure 10:
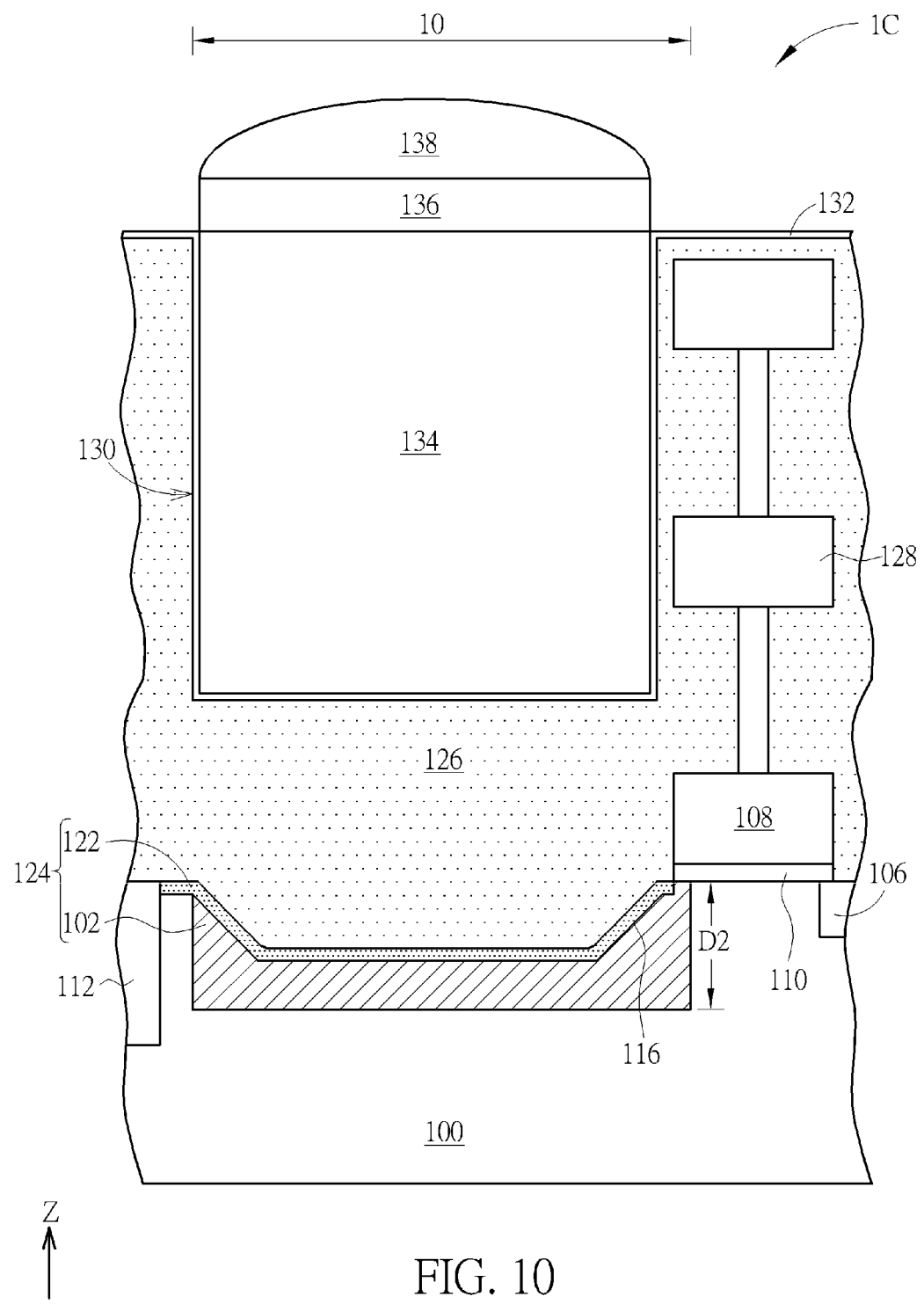
FIG. 10 is a schematic diagram illustrating a cross-sectional view of an image sensor of a second variant embodiment of the first embodiment of the present invention.

Referring to FIG. 9, FIG. 9 is a schematic diagram illustrating a cross-sectional view of an image sensor 1B of a first variant embodiment of the first embodiment of the present invention. As shown in FIG. 9, the difference between this variant embodiment and the first embodiment is that the number of the recesses 116 of the image sensor 1B is less than the image sensor 1A. In addition, the recesses 116 of the image sensor 1B are respectively disposed adjacent to the outer edge of the photosensitive area 10, thus the portion of the second-conductivity-type doped region 122 around the central region of the photosensitive area 10 has a flat surface. Owing to the design of disposing the recesses 116 adjacent to the outer edge of photosensitive area 10, the light propagates to the outer edge of the photosensitive device 124 is prevented from being reflected to the photosensitive devices of other adjoining pixels, and the crosstalk issue can further be avoided. Referring to FIG. 10, FIG. 10 is a schematic diagram illustrating a cross-sectional view of an image sensor 1C of a second variant embodiment of the first embodiment of the present invention. As shown in FIG. 10, the difference between this variant embodiment and the first embodiment is that the photosensitive device 124 of the image sensor 1C has only one recess 116, and the area of the opening of the recess 116 is approximate to the area of the photosensitive area 10. The recess 116 of this variant embodiment has an inverted trapezoid cross-sectional profile, but not limited thereto. Since the sidewall of the recess 116 inclines from the edge of the photosensitive area 10 to the center of the photosensitive area 10, the light propagates to the outer edge of the photosensitive device 124 is prevented from being reflected to other adjoining image sensors, and the crosstalk issue can further be avoided.

Figure 11:
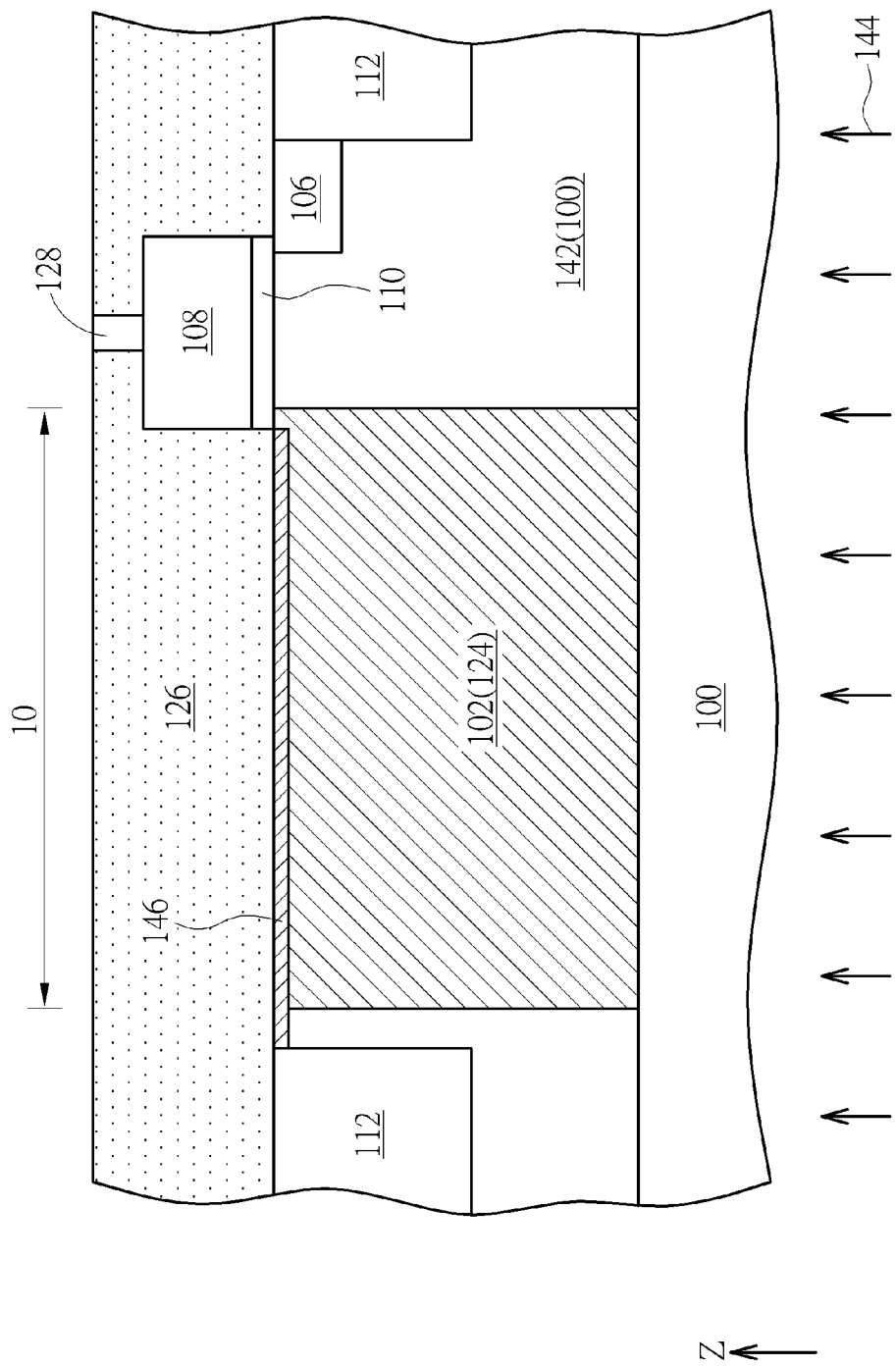
Figure 12:
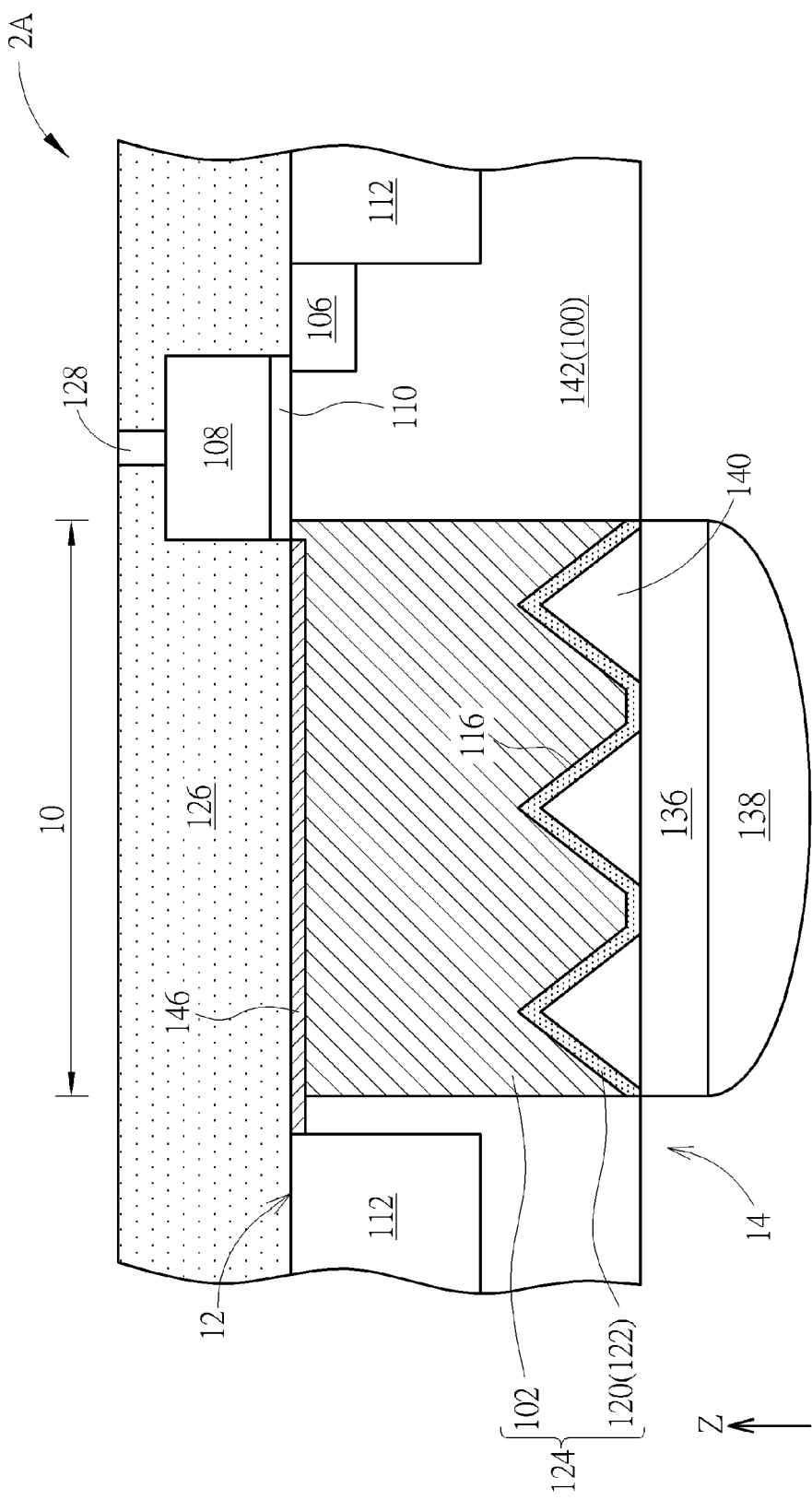

Referring to FIG. 11 and FIG. 12, FIG. 11 and FIG. 12 are schematic diagrams illustrating a fabrication method of an image sensor 2A of a second embodiment of the present invention. The image sensor 2A of the second embodiment of the present invention is a back side illumination (BSI) image sensor. As shown in FIG. 11, a semiconductor substrate 100 is provided first. The semiconductor substrate 100 of this embodiment selectively includes an epitaxial layer 142 disposed at one side of the semiconductor substrate 100. For example, the thickness of the epitaxial layer 142 is about 4 micrometers, but not limited thereto. Next, a doped diffusion region 106, a first-conductivity-type doped region 102, and one or more selective isolation structures 112 are formed in the epitaxial layer 142 of the semiconductor substrate 100. Then, a gate oxide layer 110 and a gate 108 are formed on the epitaxial layer 142. Next, a second-conductivity-type doped layer 146 is formed near the surface of the epitaxial layer 142. The second-conductivity-type doped layer 146 is disposed at one side of the gate 108. The second-conductivity-type doped layer 146 of this embodiment is not covered by the gate 108, but not limited thereto. The second-conductivity-type doped layer 146 includes dopants having the same conductivity type as the semiconductor substrate 100 (or the epitaxial layer 142), but having a higher doping concentration. Sequentially, a conductive line 128 and a dielectric layer 126 are formed on the semiconductor substrate 100, wherein the dielectric layer 126 covers the gate 108 and the second-conductivity-type doped layer 146. The conductive line 128 may be a MLI structure and is electrically connected to the gate 108. Next, a carrier substrate may be adhered to the side of the semiconductor substrate 100 having the conductive line 128 and the dielectric layer 126, and a buffer layer may be selectively disposed between the carrier substrate and the semiconductor substrate 100. The material of the carrier substrate may include silicon material similar to the material of the semiconductor substrate 100 or be a glass substrate. The material of the buffer layer may include silicon oxide, silicon nitride, or other dielectric materials. In order to emphasize the characteristic features of the image sensor 2A of this embodiment, the carrier substrate and the buffer layer are not shown in the figures. Then, a thinning process 144 is performed to remove most of the semiconductor substrate 100, but the epitaxial layer 142 is remained.

Next, as shown in FIG. 12, the recesses 116 and the second-conductivity-type doped layer 120 are formed at another side of the epitaxial layer 142 of the semiconductor substrate 100, which means the recesses 116 and the conductive line 128 are disposed at the opposite sides of the epitaxial layer 142 respectively. An annealing process may be performed to the second-conductivity-type doped layer 120 after the second-conductivity-type doped layer 120 is formed, thus the dopants in the second-conductivity-type doped layer 120 can be activated to form the second-conductivity-type doped region 122. The doping concentration of the second-conductivity-type doped region 122 is higher than the doping concentration of the epitaxial layer 142. The annealing process may be a laser annealing process for example, but not limited thereto. Next, a barrier layer (not shown) may be selectively formed on the surfaces of the recesses 116 and the epitaxial layer 142. The barrier layer may fully covers the surfaces of the recesses 116 and the epitaxial layer 142. The material of the barrier layer may be silicon nitride or silicon oxide for example, but not limited thereto. In addition, an ARC (not shown) may also be selectively formed on the surfaces of the recesses 116 and the epitaxial layer 142. Then, a filling layer 140 is formed on the surface of the epitaxial layer 142, at the side of the epitaxial layer 142 having the recesses 116. The filling layer 140 may include silicon oxide or other dielectric materials having high light transmittances. The filling layer 140 can be formed through CVD process, physical vapor deposition (PVD) process, or other suitable techniques. The portion of the filling layer 140 out of the recesses 116 can be removed by performing chemical mechanical polishing or other processes, such that the filling layer 140 has a flat surface. After that, a color filter layer 136 and a micro lens 138 are formed on the filling layer 140. The material and the fabrication method of each device in the image sensor 2A of this embodiment may be the same as the first embodiment, and will not be redundantly described.

The difference between this embodiment and the first embodiment is that the image sensor 2A is a BSI image sensor. Thus, the photosensitive device 124 is disposed between the conductive line 128 and the color filter layer 136. The semiconductor substrate 100 (or the epitaxial layer 142) includes a front side 12 and a back side 14, and the isolation structure 112 and the doped diffusion region 106 are disposed in the portion of the semiconductor substrate 100 near the front side 12. The image sensor 2A further includes the second-conductivity-type doped layer 146 disposed in the portion of the semiconductor substrate 100 near the front side 12, adjoining to the gate 108. The gate 108, the gate oxide layer 110, the conductive line 128 and the dielectric layer 126 are all disposed on the surface of the front side 12 of the semiconductor substrate 100. The recesses 116 are disposed in the portion of the semiconductor substrate 100 near the back side 14, and therefore the second-conductivity-type doped layer 146 and the conductive line 128 are disposed at one side of the semiconductor substrate 100, and the recesses 116 are disposed at another side of the semiconductor substrate 100. Accordingly, the first-conductivity-type doped region 102 is disposed between the second-conductivity-type doped layer 146 and the recesses 116, and also between the conductive line 128 and the recesses 116. In addition, the p-n junction between the first-conductivity-type doped region 102 and the second-conductivity-type doped region 122 is disposed at the back side 14 of the semiconductor substrate 100. The image sensor 2A further includes the color filter layer 136 and the micro lens 138 disposed on the surface of the back side 14 of the semiconductor substrate 100, covering the photosensitive area 10. The image sensor 2A also includes the filling layer 140 filled in the recesses 116, which is disposed between the photosensitive device 124 and the color filter layer 136.

Figure 13:
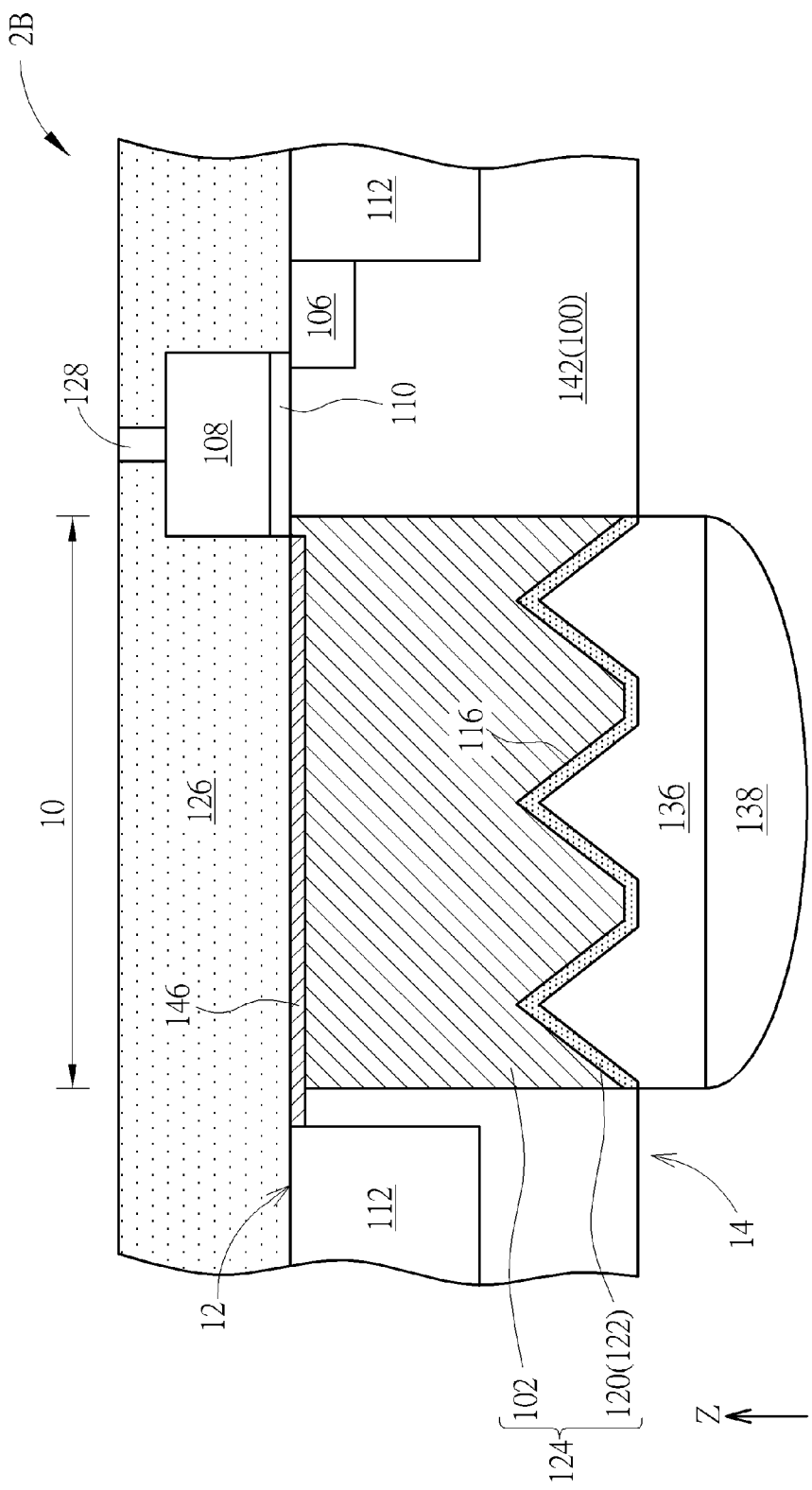
FIG. 13 is a schematic diagram illustrating a cross-sectional view of an image sensor of a first variant embodiment of the second embodiment of the present invention.

Referring to FIG. 13, FIG. 13 is a schematic diagram illustrating a cross-sectional view of an image sensor 2B of a first variant embodiment of the second embodiment of the present invention. As shown in FIG. 13, the difference between this variant embodiment and the second embodiment is that the color filter layer 136 of the image sensor 2B is directly filled in the recesses 116, and therefore the filling layer 140 shown FIG. 12 is not required. The material and the fabrication method of each device in the image sensor 2B may be the same as the second embodiment, and will not be redundantly described.

To sum up, in the fabrication method of the image sensor of the present invention, the first-conductivity-type doped region is formed in the semiconductor substrate first, and the recesses are formed on the surface of the first-conductivity-type doped region. Then, the second-conductivity-type doped region is formed on the surface of the first-conductivity-type doped region. Specifically, the second-conductivity-type doped region is formed on the surfaces of the recesses, such that the p-n junction of the photosensitive device existed between the first-conductivity-type doped region and the second-conductivity-type doped region is formed along the surfaces of the recesses. The structure of the recess of the image sensor according to the present invention keeps the light being reflected in the recess and guides the light to the bottom of the recesses, so as to increase the amount of the light absorbed by the photosensitive device. At the same time, the area of the p-n junction of the photosensitive device is increased due to the existence of the recesses, which means the light-sensing area is increased and the quantum efficiency of the image sensor is then improved. In addition, the propagating direction of the light can be adjusted by the recesses, so as to prevent the light propagating to the outer edge of the photosensitive device from being reflected to other adjoining image sensors. As a result, the crosstalk issue can be effectively improved. In short, the efficiency and the accuracy of the image sensor are effectively improved according to the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabrication method of an image sensor, comprising:
providing a semiconductor substrate, wherein a photosensitive area is defined on a surface of the semiconductor substrate;
forming a first-conductivity-type doped region near the surface of the semiconductor substrate and in the photosensitive area;
performing an etching process to remove a portion of the first-conductivity-type doped region of the semiconductor substrate to form at least one recess in the photosensitive area;
performing an ion implantation process to form a second-conductivity-type doped region on a surface of the first-conductivity-type doped region in the photosensitive area, wherein the first-conductivity-type doped region and the second-conductivity-type doped region have different conductivity types, and the first-conductivity-type doped region and the second-conductivity-type doped region form a photosensitive device;
forming a second-conductivity-type doped layer and a conductive line on another surface of the semiconductor substrate before forming the recess, wherein
the second-conductivity-type doped layer and the conductive line are disposed at one side of the semiconductor substrate,
the recess is disposed at the other side of the semiconductor substrate, and
the first-conductivity-type doped region is disposed between the second-conductivity-type doped layer and the recess and between the conductive line and the recess; and
sequentially forming a color filter layer and a micro lens on a surface of the second-conductivity-type doped region.

2. The fabrication method of the image sensor according to claim 1, further forming a filling layer filled in the recess before forming the color filter layer and the micro lens.

3. A fabrication method of an image sensor, comprising:
providing a semiconductor substrate, wherein a photosensitive area is defined on a surface of the semiconductor substrate;

forming a first-conductivity-type doped region near the surface of the semiconductor substrate and in the photosensitive area;

performing an etching process to remove a portion of the first-conductivity-type doped region of the semiconductor substrate to form at least one recess in the photosensitive area;

performing an ion implantation process to form a second-conductivity-type doped region on a surface of the first-conductivity-type doped region in the photosensitive area, wherein the first-conductivity-type doped region and the second-conductivity-type doped region have different conductivity types, and the first-conductivity-type doped region and the second-conductivity-type doped region form a photosensitive device;

forming a dielectric layer on the surface of the semiconductor substrate, wherein the dielectric layer covers the photosensitive device and is filled in the recess;

forming a conductive line on the surface of the semiconductor substrate;

removing a portion of the dielectric layer to form a light pipe opening in the dielectric layer on the photosensitive device;

filling a material with a high refractive index in the light pipe opening to form a light pipe above the photosensitive device; and sequentially forming a color filter layer and a micro lens on a surface of the light pipe.

4. The fabrication method of the image sensor according to claim 3, further comprising forming a second-conductivity-type sacrificial layer in the photosensitive area before forming the recess, wherein the second-conductivity-type sacrificial layer covers the surface of the first-conductivity-type doped region, and an annealing process is performed after the ion implantation process.

5. The fabrication method of the image sensor according to claim 3, wherein a size of the recess is gradually reduced from an opening of the recess to a bottom of the recess.

6. The fabrication method of the image sensor according to claim 3, wherein the recess is a cone-shaped recess or the recess has a trapezoid cross-sectional profile.

7. The fabrication method of the image sensor according to claim 3, wherein the recess is disposed adjacent to an edge of the photosensitive area.

8. The fabrication method of the image sensor according to claim 3, wherein an area of the opening of the recess is approximate to an area of the photosensitive area.

9. The fabrication method of the image sensor according to claim 3, wherein the etching process is an anisotropic wet etching process or an anisotropic dry etching process.

10. The fabrication method of the image sensor according to claim 9, wherein the semiconductor substrate is a silicon-based substrate, and an etchant of the anisotropic wet etching process comprises tetramethylammonium hydroxide (TMAH), ethylene diamine and pyrocatechol (EDP), alkali-based etching solution, diluted hydrofluoric (DHF), hydrogen fluoride (HF), buffered oxide etching (BOE) solution or SC-1 cleaning liquid.

* * * * *